United States Patent
Kawamata et al.

(10) Patent No.: US 8,845,826 B2
(45) Date of Patent: Sep. 30, 2014

(54) LEAD-FREE SOLDER FOR VEHICLES AND A VEHICLE-MOUNTED ELECTRONIC CIRCUIT USING THE SOLDER

(75) Inventors: Yuji Kawamata, Tochigi (JP); Minoru Ueshima, Matsudo (JP); Tomu Tamura, Kawanishi (JP); Kazuhiro Matsushita, Hamamatsu (JP); Masashi Sakamoto, Mino (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 12/452,610

(22) PCT Filed: Jul. 14, 2008

(86) PCT No.: PCT/JP2008/062716
§ 371 (c)(1),
(2), (4) Date: Aug. 11, 2010

(87) PCT Pub. No.: WO2009/011341
PCT Pub. Date: Jan. 22, 2009

(65) Prior Publication Data
US 2010/0294565 A1 Nov. 25, 2010

(30) Foreign Application Priority Data
Jul. 13, 2007 (JP) .................. 2007-184782

(51) Int. Cl.
C22C 13/02 (2006.01)
H05K 3/34 (2006.01)
B23K 35/26 (2006.01)
C22C 13/00 (2006.01)

(52) U.S. Cl.
CPC ............... *C22C 13/00* (2013.01); *B23K 35/262* (2013.01); *H05K 3/3463* (2013.01); *C22C 13/02* (2013.01)
USPC .......................................... 148/400; 420/561

(58) Field of Classification Search
USPC .................... 148/400; 420/499, 561
See application file for complete search history.

(56) References Cited

U.S. PATENT DOCUMENTS

| | | | | |
|---|---|---|---|---|
| 4,901,137 | A * | 2/1990 | Sato et al. | 257/712 |
| 6,517,602 | B2 * | 2/2003 | Sato et al. | 75/255 |
| 2003/0021718 | A1 * | 1/2003 | Munekata et al. | 420/560 |
| 2007/0071634 | A1 * | 3/2007 | Huang et al. | 420/560 |

FOREIGN PATENT DOCUMENTS

| | | |
|---|---|---|
| JP | 05228685 | 9/1993 |
| JP | 08132277 | 5/1996 |
| JP | 09/326554 | 12/1997 |
| JP | 11221695 | 8/1999 |

(Continued)

OTHER PUBLICATIONS

J C Suhling et al, "Thermal cycling reliability of lead free solders for automotive applications", The Ninth Intersociety Conference on Thermal and Thermomechanical Phenomena in Electronic Systems, 2004. ITHERM '04, vol. 2, Jun. 1, 2004, pp. 350-357.

(Continued)

*Primary Examiner* — Sikyin Ip
(74) *Attorney, Agent, or Firm* — Michael Tobias

(57) ABSTRACT

A Sn—Ag—Cu—Bi lead-free solder which can be used for soldering of vehicle-mounted electronic circuits and which has excellent resistance to heat cycles and mechanical strength is provided. The solder contains Ag: 2.8-4 mass %, Bi: 1.5-6 mass %, Cu: 0.8-1.2 mass %, and a remainder of Sn.

11 Claims, 3 Drawing Sheets

(56) References Cited

FOREIGN PATENT DOCUMENTS

| JP | 2000-015476 A | * | 1/2000 |
|----|---------------|---|--------|
| JP | 2000015476 | | 1/2000 |
| JP | 2000349433 | | 12/2000 |
| JP | 2001504760 | | 4/2001 |
| JP | 2001334385 | | 12/2001 |
| JP | 2001358458 | | 12/2001 |
| JP | 2002011593 | | 1/2002 |
| JP | 2002120085 | | 4/2002 |
| JP | 2002126895 | | 5/2002 |
| JP | 2002336988 | | 11/2002 |
| JP | 2003094195 | | 4/2003 |
| JP | 2004-122223 A | * | 4/2004 |
| JP | 2004122223 | | 4/2004 |

OTHER PUBLICATIONS

L. Whiteman, American Competitiveness Institute, "Salt Atmosphere, Temperature Humidity, and Mechanical Shock Environmental Stress Testing Results of the JG-PP/JCAA Lead Free Soldering Program", Conference Proceedings, ACInst., Sep. 25, 2005, pp. 841-845.

D. Hillman et al, "JCAA/JG-PP No-Lead Solder Project: −55° C. to +125° C. Thermal Cycle Testing Final Report for the CSP, Hybrid & SMT Resistor/Capacitor Components", ITB Inc., Jun. 1, 2007.

K S Kim et al, "Effects of fourth alloying additive on microstructures and tensile properties of Sn-Ag-Cu alloy and joints with Cu", Microelectronics Reliability, Elsevier Science Ltd, vol. 43, No. 2, Jan. 1, 2003, pp. 259-267.

* cited by examiner

LEAD-FREE SOLDER FOR VEHICLES AND A VEHICLE-MOUNTED ELECTRONIC CIRCUIT USING THE SOLDER

TECHNICAL FIELD

This invention relates to a lead-free solder for use under severe conditions having large temperature variations, such as a lead-free solder for use in an environment such as the vicinity of an automotive engine where there is a large temperature difference between periods when the engine is operating and periods when the engine is off. This invention also relates to a vehicle-mounted electronic circuit using the lead-free solder.

BACKGROUND ART

Due to the harmful effects of lead on the human body, the use of lead-containing solders is now regulated. For this reason, Sn-based, lead-free solders have become widely used. At present, Sn-3Ag-0.5Cu solder is much used as a lead-free solder in so-called household electronic equipment such as televisions, video cameras and decks, mobile telephones, and personal computers. This lead-free solder is somewhat inferior to conventional Pb—Sn solders with respect to solderability. However, as a result of improvements in flux and soldering apparatuses, it can now be used without problems, and it does not experience peeling or similar problems in ordinary use over the lifespan of household electronic equipment.

A heat cycle test is used to test the durability of soldered joints in household electronic equipment. In a heat cycle test which is widely used for household electronic equipment, chip resistor components measuring 3.2×1.6×0.6 mm are soldered to a printed circuit board, and a heating and cooling cycle in which soldered joints are held at a high temperature of +85° C. and then a low temperature of −40° C. for 30 minutes at each temperature is repeated for 500 cycles. Subsequently, the state of electrical conduction between conductors is measured, The result is acceptable if conduction takes place.

Electronic circuits having electronic parts soldered to (or mounted on) a printed circuit board are also used in on automobiles (such circuits are referred to below as vehicle-mounted electronic circuits). Heat cycle tests are also carried out on vehicle-mounted electronic circuits. A heat cycle test used for vehicle-mounted electronic circuits is carried out under extremely severe test conditions which, as described below, are far more severe than those of the above-described heat cycle test for household electronic equipment.

There have been many proposals in the past of lead-free solders having excellent resistance to heat cycles. See Patent Documents 1-3.

However, none of them exhibited sufficient resistance to heat cycles when tested by a heat cycle test of the type which is currently required for soldered joints of vehicle-mounted electronic circuits.

Patent Document 1: JP 05-228685 A1
Patent Document 2: JP 09-326554 A1
Patent Document 3: JP 2000-349433 A1

DISCLOSURE OF INVENTION

Problem which the Invention is to Solve

None of the actual compositions disclosed in the examples of Patent Documents 1-3 provided satisfactory results when a heat cycle test was carried out for 500 heat cycles between −40° C. and +85° C. according to current standards or when a heat cycle test was carried out for 1500 heat cycles between −55° C. and +125° C.

The resistance of solder to heat cycles cannot be evaluated by tests of bulk properties such as a tensile strength test, a creep test, and a fatigue test which are presently carried out. In order to evaluate the resistance of a soldered joint to heat cycles, it is thought to be best to carry out a heat cycle test on a printed circuit board actually having electronic parts mounted thereon. A heat cycle test for vehicle-mounted electronic circuits is more severe than a heat cycle test for household electronic equipment (which measures whether conduction takes place after 500 cycles of heating and cooling from +85° C. to −40° C.). Vehicle-mounted electronic circuits require a prescribed bonding strength for soldered joints in an extremely severe heat cycle test which performs at least 1500 cycles and preferably 3000 cycles of heating and cooling from −55° C. to +125° C. There are no conventional lead-free solders which can satisfy this requirement.

Vehicle-mounted electronic circuits are used in equipment for electrically controlling engines, power steering, brakes, and the like. They have become extremely important components for maintaining safe operation of automobiles, and they must be able to stably operate for long periods of time without malfunctioning. A vehicle-mounted electronic circuit for engine control is mounted in the vicinity of an engine and accordingly has a very severe environment of use. The vicinity of an engine where such a vehicle-mounted electronic circuit is installed is at a high temperature of 100° C. or above when the engine is operating, and when the engine stops, the temperature becomes the temperature of the outside air, which in frigid regions of North America or Siberia, for example, is a low temperature of −30° C. or below in winter. Accordingly, vehicle-mounted electronic circuits may be exposed to heat cycles from −30° C. or below to +100° C. or above due to repeated operation and stopping of engines.

When a vehicle-mounted electronic circuit is placed for a long period in an environment having large temperature variations (referred to below as a heat cycle environment), the solder and the printed circuit board of the circuit undergo thermal expansion and contraction. Since solder, which is made of metal, and a printed circuit board, which is made of a resin, have different coefficients of thermal expansion from each other, stress is applied to both members. The printed circuit board which is made of resin does not experience any problems due to its ability to expand and contract, but expansion and contraction of metallic solder over long periods causes metal fatigue, and after the passage of long periods, cracks may develop and fracture of the solder may occur.

Metal fatigue occurs due to stresses applied over long periods. Therefore, even if a vehicle-mounted electronic circuit does not experience problems for a while immediately after the start of use of a new automobile, when the automobile has been operated for long periods, the solder in soldered joints may peel off. The cause of this peeling is that when a soldered joint is exposed to a heat cycle environment, its bonding strength decreases although not to the extent to cause fracture but to an extent sufficient to cause peeling of the solder due to large shocks applied by the road surface or continuous small vibrations applied by the engine while a vehicle is being driven.

Accordingly, solder for use in a vehicle-mounted electronic circuit needs to have excellent resistance to heat cycles in a heat cycle environment. When carrying out soldering of vehicle-mounted electronic circuits, it is desirable to use a Sn-3Ag-0.5Cu lead-free solder which has already been used in household electronic equipment. However, this lead-free solder does not have sufficient resistance to heat cycles in a severe heat cycle environment, so it cannot be used in a severe heat cycle environment having an extremely large difference between high temperatures and low temperatures such as is experienced in an automobile.

An object of the present invention is to develop a solder alloy which can withstand 1500 heat cycles at temperatures from −55° C. to +125° C. which are currently considered to be sufficiently severe as a test for vehicle-mounted electronic circuits.

Solder for use in a vehicle-mounted electronic circuit must of course not only have excellent solderability but must also be capable of being soldered at a temperature which does not have thermal effects on electronic parts or printed circuit boards during soldering. In general, it is thought that soldering should be carried out a temperature which is 10-30° C. above the liquidus temperature of solder. As the liquidus temperature of solder increases, the soldering temperature must also increase. However, if the soldering temperature becomes high, electronic parts and printed circuit boards undergo thermal damage or suffer a deterioration in performance. In the case of reflow soldering of electronic parts or printed circuit boards, if the soldering temperature is 250° C. or lower, electronic parts and printed circuit boards do not undergo thermal damage. Accordingly, assuming that it is necessary for the soldering temperature to be 250° C. or lower, the liquidus temperature of solder should be 240° C. or lower and preferably 235° C. or lower.

A solder for use in a vehicle-mounted electronic circuit preferably should have a solidus temperature of at least 170° C. This is because when an environment in which a soldered joint is disposed reaches a high temperature, the closer is the high temperature to the solidus temperature of the solder, the weaker the bonding strength of the solder becomes. If a vehicle-mounted electronic circuit is disposed in an engine compartment, the engine compartment may reach a high temperature close to 100° C. Therefore, the solidus temperature of solder is preferably at least 170° C., which is at least 70° C. higher than the high temperature of the engine compartment.

Another object of the present invention is to provide a lead-free solder which can be used for soldering of vehicle-mounted electronic circuits and which exhibits high reliability, as well as a vehicle-mounted electronic circuit which uses the solder.

More specifically, the present invention provides a lead-free solder alloy for vehicle-mounted electronic circuits which exhibits excellent resistance to heat cycles as evaluated by the fact that there are no cracks passing through a soldered joint when tested by a heat cycle test in which temperatures of −55° C. and +125° C. are applied for 1500 cycles with a holding time of 30 minutes at each temperature. The present invention also provides a vehicle-mounted electronic circuit using the alloy.

The primary function of a power module or a hybrid semiconductor circuit having a ceramic substrate or a metal substrate is converting the voltage, the current, or the frequency of an input power supply. The input power supply is a high-power lithium ion battery, a lead-acid battery which is used in automobiles or motorcycles, power generation by a motor in an automobile or an electric train, a power line, or a household power supply from 100 to 220 volts. The power from these input power supplies can be converted to drive the motor of a drive portion or to illuminate headlights, such as the headlights of an automobile, which require a large amount of electric power. Alternatively, electricity which is generated by electromagnetic coils at the time of motor braking is converted and used to charge a lithium battery or a lead-acid battery. Therefore, a large amount of heat is generated within such a circuit. Chip parts such as resistors and capacitors which are essential in forming electronic circuits are of large size, such as 3216 parts. Therefore, with these electronic circuits, joints of the circuits with a printed circuit board are easily destroyed by heat cycles.

A power module, which is used in power supply circuits and the like, is an electronic circuit which employs one or more power transistors. Cooling fins are often disposed on a power module. Because power modules carry large currents, they have thick wiring and a large joint area.

Hybrid semiconductor circuits, which are also referred to as hybrid integrated circuits, have semiconductor chips mounted on a ceramic substrate having wiring, resistors, capacitors, and the like formed thereon. Such an electronic circuit belongs to the preceding generation of integrated circuits, but since an integrated circuit using a silicon wafer has the drawback of poor heat resistance, hybrid semiconductor circuits which can carry large currents and have good heat resistance are still used for mounting on vehicles. Such hybrid semiconductor circuits use large-sized chip parts.

The present invention provides a lead-free solder alloy for vehicle-mounted electronic circuits which is ideal for power modules or hybrid semiconductor circuits, and a power module or hybrid semiconductor circuit for mounting on a vehicle which uses the alloy.

Means for Solving the Problem

The present inventors knew that conventional lead-free solders which are said to have excellent resistance to heat cycles cannot satisfy the higher reliability required of vehicle-mounted electronic circuits, and that further improvements in lead-free solders are necessary. Accordingly, the present inventors tested solder alloys having different compositions and structures using actual printed circuit boards having electronic parts mounted thereon to measure the bonding strength of solder between the electronic parts and the substrate after a heat cycle test. They found that a solder alloy having a certain composition and in particular a solid solution structure of the precipitate-reversion type has the effect of suppressing a deterioration in bonding strength during a heat cycle test. As a result of this finding, they completed the present invention.

Namely, the present invention is a lead-free solder formed from a Sn—Ag—Cu based solder alloy containing a dissolved element and having an alloy structure which at room temperature comprises either a supersaturated solid solution or a solid solution with a dissolved element precipitated therefrom, and which at a high temperature in a heat cycle environment comprises a solid solution in which a dissolved element which precipitated at low temperatures is again dissolved in a Sn matrix.

According to the present invention, the strength of solder during use in a heat cycle environment can be markedly improved.

In this description, the above-described alloy structure of an alloy according to the present invention including an alloy structure at high temperatures or at room temperature and an alloy structure which is comprised of a solid solution or a supersaturated solid solution will collectively be referred to as a "solid solution structure of the precipitate-reversion type".

FIG. 1 is an explanatory view of the change in structure of an alloy according to the present invention caused by a change in temperature between a high temperature environment and a low temperature environment. In a high temperature state in which a sufficiently high solid solubility limit can be maintained, Bi dissolves in a Sn matrix and forms a solid solution. However, in a phase diagram, precipitation of Bi takes place when cooling starts from this state. Precipitates of elements like Bi which can be dissolved in Sn in large amounts to form a solid solution are expected to easily coarsen so that Bi itself does not contribute to the mechanical properties of Sn to a significant extent. However, in the present invention, in a heat cycle test in which exposure to a high temperature environment and a low temperature environment are repeated for a limited period of time at each temperature, it was found that Bi which was dissolved in Sn at a high temperature does not coarsely precipitate at the time of cooling, and that the Bi is present in Sn as a supersaturated solid solution or as fine precipitates formed from a supersaturated solid solution. The fine precipitates are so fine that they cannot be observed with a scanning electron microscope. If the content of Bi is small, Bi cannot be present at room temperature as a supersaturated solid solution or as fine precipitates from a supersaturated solid solution, so propagation of cracks in a heat cycle test cannot be suppressed. On the other hand, if the amount of Bi is too large, the propagation of cracks may become markedly faster due to segregation of Bi at the start of solidification. In the present invention, by adjusting the alloy composition, Bi is present in a proportion which always forms a supersaturated solid solution in Sn at room temperature. Therefore, upon the start of a cooling stage in a heat cycle environment, Bi immediately forms a supersaturated solid solution.

It is unexpected that the above-described "solid solution structure of the precipitate-reversion type" can be exhibited in a heat cycle in which the temperature is maintained at −55° C. and +125° C. for 30 minutes at each temperature. From a phase diagram which always assumes an equilibrium state, it can be expected that coarsening of Bi will proceed during cooling to room temperature or to a low temperature environment for an alloy having a composition according to the present invention. However, it is totally unexpected that coarsening of Bi can be suppressed even after repetition of 1500 or 3000 heat cycles consisting of heating for 30 minutes and cooling for 30 minutes and that Bi continues to exist in Sn as a supersaturated solid solution or as fine precipitates from a supersaturated solid solution whereby excellent effects of a type which were not thought possible in the part are exhibited.

Concerning coarse Bi precipitates formed in the initial stage of solidification, it is also unexpected that by carrying out heat treatment at 125° C. for 200 hours or performing a heat cycle test for 500 cycles at −55° C. and +125° C. for 30 minutes at each temperature, such Bi can be dispersed in Sn as a supersaturated solid solution or as fine precipitates from a supersaturated solid solution even at room temperature, and that the reliability of bonding is increased by imparting a thermal load such as one achieved by the above heat cycle or by leaving the alloy at a high temperature.

The effect of precipitation of fine Bi from a supersaturated solid solution in the present invention is different from the effect of precipitation of coarse Bi due to segregation at the time of solidification. In the former case, fine Bi, which is uniformly present in a Sn matrix either as a supersaturated solid solution or as fine precipitates from a supersaturated solid solution, has the effect of increasing the mechanical strength of the alloy. In the latter case, Bi which is a dissolved element coarsely segregates in the finally solidified portion, in crystal grain boundaries, and between dendrite arms, so Bi cannot be expected to provide the effect of suppressing movement of dislocations and thereby improving strength. Thus, such "segregation type alloy structure" and the above-described "solid solution structure of the precipitate-reversion type" are clearly distinguishable from the standpoints of their mechanisms of formation, their metallurgical structures, and their effects.

In other words, in the present invention, it is necessary to prepare an alloy so that such segregation of Bi does not occur. Specifically, preferred means for this purpose include adjusting the Bi content of the alloy, carrying out rapid solidification at the time of alloy preparation, carrying out rapid solidification of molten solder during soldering, or performing heat treatment such that coarse Bi formed by segregation during solidification is converted into a supersaturated solid solution or fine precipitates from a supersaturated solid solution. Such heat treatment can be achieved at the time of conduction of a soldered joint if the joint is used with a part having a large thermal load such as a power device mounted on a substrate, or for parts having a small thermal load, by heating at 125° C. for 50-300 hours. It is preferable to avoid growth of dendrite crystals.

The present inventors also found that in an alloy having a composition near a Sn—Ag—Cu eutectic composition, reliability varies with the Cu content. Namely, they found that with a Cu content of at least 0.8 mass %, reliability of a solder for use in a vehicle-mounted electronic circuit is improved, and that by simultaneously adding Bi, the resistance to heat cycles demanded of vehicle-mounted electronic circuits having electronic parts mounted thereon is satisfied.

In the present description, "resistance to heat cycles demanded of vehicle-mounted electronic circuits" generally means that the circuits can be stably used for long periods in a heat-cycle environment which is experienced during operation of an automobile. Specifically, it means that cracks do not completely pass through soldered joints after 1500 cycles of holding a soldered joint at −55° C. and +125° C. for 30 minutes at each temperature in a heat cycle test.

Thus, with a solid solution structure of the precipitate-reversion type according to the present invention, when a solid solution is cooled, a dissolved element which is dissolved in excess of its solubility limit in the matrix produces a greater increase in strength than can be obtained by a usual solid solution, due to solid solution-hardening with a supersaturated solid solution or precipitation strengthening from a supersaturated solid solution to form fine precipitates. This effect is similar to the effect of increasing strength by precipitation of an intermetallic compound. However, with an intermetallic compound, as heat cycles progress, the precipitated fine acicular crystals of the intermetallic compound become massive or agglomerated crystals, and the effect of increasing strength is markedly decreased. In contrast, with a supersaturated solid solution or with Bi precipitated from a supersaturated solid solution in the above-described "solid solution structure of the precipitate-reversion type", the dissolved elements which are present as a supersaturated solid solution or fine precipitates from a supersaturated solid solution are redissolved when heated to a high temperature in a heat cycle environment, while at room temperature or a low temperature, Bi returns to the state of a supersaturated solid solution or fine precipitates of B precipitated to from a supersaturated solid solution in the Sn matrix.

Accordingly, with the above-described solid solution structure of the precipitate-reversion type, a strength improving effect of Bi in the form of a supersaturated solid solution or fine precipitates from a supersaturated solid solution can be expected regardless of the degree to which thermal fatigue has advanced. Namely, the structure of Bi which is either a supersaturated solid solution or is precipitated from a supersaturated solid solution is repeatedly restored during use in a heat cycle environment, so its strength-improving effect continues semi-permanently. As a result, a deterioration in the bonding strength of soldered joints in a heat cycle environment can be suppressed, and resistance to heat cycles of the joints can be increased.

When the amount of Cu which is added is 1.5 mass %, it is possible to obtain resistance to heat cycles which is satisfactory for a vehicle-mounted electronic circuit even when Bi is not added. However, in this case, the liquidus temperature exceeds 250° C., which makes mounting operation difficult. Therefore, in the present invention, with a solder alloy intended for use on a typical printed circuit board, the upper limit on the Cu content is 1.2 mass % and preferably at most 1.0 mass %.

In general, it is thought that the resistance of solder to heat cycles is improved if an intermetallic compound is present in the solder matrix. As a result of diligent research by the present inventors concerning resistance to heat cycles of lead-free solders in which an intermetallic compound is present, it was found that the resistance to heat cycles greatly varies depending upon the shape, size, and distribution of the intermetallic compound. For example, if an intermetallic compound in the form of acicular crystals is present, when cracks develop, the acicular crystals suppress the propagation of the cracks since they act like reinforcing bars in reinforced concrete. However, during continued use in a heat cycle environment, the acicular crystals become spherical and coarse. If they coarsen to a size of around several micrometers, they no longer contribute to an improvement in resistance to heat cycles.

In addition, it was also found that in a heat cycle environment, if a crack develops in the solder of a soldered joint, crystals of an intermetallic compound which are present in the direction of propagation of the crack become spherical and coarse due to the stresses applied by the crack. The coarsened intermetallic compound can no longer suppress the propagation of cracks.

The mechanism by which fine acicular crystals of $Ag_3Sn$ and $Cu_6Sn_5$, which are intermetallic compounds formed in the Sn matrix of Sn based lead-free solder containing Ag and Cu, coarsen to form granular crystals will be briefly explained.

When $Ag_3Sn$ and $Cu_6Sn_5$ are in a fine crystalline state, the area of the interface of these intermetallic compounds with the Sn matrix is extremely large, so they are in a state in which the sum of their interfacial energy is extremely high. On the other hand, as a reaction progresses as a natural phenomenon from a high energy state to a low energy state, the area of the interface between $Ag_3Sn$ or $Cu_6Sn_5$ and the Sn matrix becomes smaller. Namely, these intermetallic compounds change from fine acicular crystals into large spherical crystals. This coarsening of intermetallic compounds easily occurs at a high temperature in a heat cycle environment. As this change progresses, the intermetallic compounds can no longer be expected to provide the effect of improving resistance to heat cycles. Incidentally, coarsening of intermetallic compounds scarcely takes place at the tip of a fillet where it is relatively difficult for stresses to be applied, while coarsening is pronounced in joint portions such as the bottom of chip parts where stresses concentrate. When cracks develop, spheroidization and coarsening of intermetallic compounds occur in the direction of propagation of cracks, and the coarsened intermetallic compounds can no longer stop the propagation of cracks.

In a solid solution structure of the precipitate-reversion type according to the present invention, if the amount of the above-described intermetallic compounds is small, it is difficult to suppress the propagation of cracks. Therefore, it is necessary that at least 40% of the volume be occupied by a eutectic structure of $Ag_3Sn$ or $Cu_6Sn_5$ with Sn. To this end, it is necessary that the content of Ag be at least 2.5% and that the content of Cu be at least 0.8%. Preferably, the content of Ag is at least 2.8% and the content of Cu is at least 0.9%.

According to the findings of the present inventors, the effect of Bi in an alloy structure of the precipitate-reversion type according to the present invention is as follows.

The presence of Bi in any of a solid solution, a supersaturated solid solution, and a solid solution containing fine Bi precipitates in a lead-free solder according to the present invention contributes to an improvement in resistance to heat cycles of the lead-free solder. A solid solution has solute atoms which are present either as interstitial atoms in stable positions in the crystal lattice of a solvent metal or by mutual replacement of a solvent atom and a solute atom in their common crystal lattice position. In a lead-free solder according to the present invention, Bi is dissolved in a Sn matrix to form a solid Solution. There is a difference in size between atoms of Sn which are the solvent atoms and atoms of Bi which are the solute atoms, and this difference causes strains in the solid solution and hardens the solder alloy. In the case in which Bi precipitates from a supersaturated solid solution, at the point when the solder has just completely solidified, Bi solidifies in the form of a supersaturated solid solution. However, as the temperature subsequently decreases, Bi in excess of its solubility limit finely precipitates, and further hardening occurs due to lattice strains between the precipitates and the Sn matrix, leading to an improvement in resistance to heat cycles.

Accordingly, a solder alloy in which fine intermetallic compounds are present in a Sn matrix and in which Bi is dissolved in Sn to form a solid solution and then precipitates from a supersaturated solid solution has a further improved resistance to heat cycles due to the synergistic effects of the intermetallic compounds and Bi in the above-described forms.

When a vehicle-mounted electronic circuit is exposed to a heat cycle environment as described above, intermetallic compounds in the lead-free solder are coarsened and spheroidized so that the effect of suppressing cracks by the intermetallic compounds disappears. Even under such conditions, the propagation of cracks can be suppressed if a Sn matrix itself in which Bi is dissolved to form a solid solution and a Sn matrix in which Bi is finely precipitated from the supersaturated solid solution have the effect of improving resistance to heat cycles. However, since fine intermetallic compounds have a sufficient effect on suppression of cracks until they coarsen, in order to continue the effect of suppressing crack propagation, it is necessary that at least 40% of the volume be occupied by a eutectic structure of $Ag_3Sn$ or $Cu_6Sn_5$ with Sn. For this purpose, it is necessary that the content of Ag be at least 2.5% and that the content of Cu be at least 0.8%. Preferably, the content of Ag is at least 2.8% and the content of Cu is at least 0.9%.

Bi is dissolved in a Sn matrix in a concentration of at least 12 mass % at 125° C. Therefore, with the Bi content according to the present invention, when the temperature returns to room temperature, Bi forms a supersaturated solid solution, from which fine precipitates of Bi are formed and are present regardless of the degree of thermal fatigue of an alloy. Therefore, Bi has no decrease in its effect of improving the strength of an alloy as heat cycles progress, unlike intermetallic compounds such as $Ag_3Sn$ and $Cu_6Sn_5$.

Accordingly, when a member having soldered joints formed with a Sn based lead-free solder is placed in a heat cycle environment, if the Sn matrix contains intermetallic compounds precipitated therein and Bi dissolved therein to form a solid solution, due tale synergistic effects of the intermetallic compounds and the solid solution Bi, excellent resistance to heat cycles can be maintained in the initial period. Even if the member is placed for long periods in a heat cycle environment and the intermetallic compounds take on large spherical shapes, and, for example, cracks develop in the solder of soldered joints, the Sn matrix containing Bi in solid solution suppresses the propagation of cracks. Therefore, the lifespan of the soldered joints is extended until they completely peel off.

Thus, with a lead-free solder having Bi dissolved as a solid solution in a Sn matrix, even if the solder is disposed in an extremely severe heat cycle environment which is inconceivable for household electronic equipment such as an environment in which 1500 cycles or 3000 cycles of exposure to $-55°$ C. and $+125°$ C. occur for 30 minutes at each temperature, excellent resistance to heat cycles can be maintained due to Bi which is present as solid solution in the Sn matrix or as fine precipitates from a supersaturated solid solution. In the initial stage after soldering, a portion of Bi may be present as coarse precipitates due to segregation. However, even in this case, when a member having soldered joints with a Bi-containing lead-free solder is placed in a heat cycle environment, Bi which was coarse in the initial stage of the heat cycle environment is gradually refined with the passage of time, resulting in an improvement in resistance to heat cycles. Naturally, there is preferably as little segregation of Bi as possible from the start.

The present invention is as follows.

(1) A lead-free solder for vehicle-mounted electronic circuits characterized by consisting essentially of Ag: 2.8-4 mass %, Bi: 1.5-6 mass %, Cu: 0.8-1.2 mass %, and a remainder of Sn, and more particularly by having a solid solution is structure of the precipitate-reversion type.

(2) A lead-free solder as set forth above in (1) consisting essentially of Ag: 3-3.4 mass %, Bi: 2.5-5 mass %, Cu: 0.9-1.1 mass %, and a remainder of Sn.

(3) A lead-free solder as set forth above in (1) or (2) containing at least one element selected from the group consisting of Ni, Fe, and Co in a total amount of 0.005-0.05 mass % in place of a portion of the Sn.

(4) A lead-free solder as set forth above in any of (1)-(3) containing at least one element selected from the group consisting of P, Ge, and Ga in a total amount of 0.0002-0.02 mass % in place of a portion of the Sn.

(5) A lead-free solder as set forth above in any of (1)-(4) containing at most 1 mass % of In in place of a portion of the Sn.

(6) A lead-free solder as set forth above in any of (1)-(5) containing at most 1 mass % of Zn in place of a portion of the Sn.

(7) A vehicle-mounted electronic circuit having a soldered joint made from a lead-free solder as set forth above in any of (1)-(6).

(8) A vehicle-mounted electronic circuit which is a hybrid semiconductor circuit having a soldered joint made from a lead-free solder as set forth above in any of (1)-(6).

In a heat cycle test according to the present invention, a lead-free solder paste is applied by printing to a thickness of 150 μm to patterned portions to be soldered (each 1.6×1.2 mm) of a printed circuit board, chip resistor parts measuring 3.2×1.6×0.6 mm are mounted thereon, soldering is performed in a reflow furnace with a peak temperature of 245° C., and then the printed circuit board having the chip resistor parts soldered thereon is subjected to 1500 cycles, with each cycle consisting of holding at $-55°$ C. and $+125°$ C. for 30 minutes at each temperature.

In the present invention, "excellent resistance to heat cycles" means that when a force in the horizontal direction is applied from the side to chip resistor parts on a printed circuit board in a bonding strength tester after the above-described heat cycle test until the chip resistor parts are peeled off, the average (peeling) strength is at least 20 N (Newtons) and the minimum strength value is at least 15 N.

There are no particular limitations on the mode of use of a solder alloy according to the present invention. It can be used for flow soldering in which the solder is used in a molten state or for reflow soldering in which the solder is used as a solder paste by being mixed with a suitable flux. It can also be used as rosin-core solder for soldering with a soldering iron; or as a solder preform having a shape such as a pellet, a ribbon, or a ball. However, it is preferably used as a solder paste.

Effects of the Invention

A lead-free solder according to the present invention has a composition exhibiting excellent heat cycle resistance, and in a heat cycle environment, its resistance to heat cycles can be sufficiently exhibited from an initial stage due to the presence of fine acicular crystals of intermetallic compounds and due to the presence of Bi which is either dissolved as a solid solution in the Sn matrix or precipitated as fine precipitates from a supersaturated solid solution.

Even if a lead-free solder according to the present invention is placed for long periods in a heat cycle environment and fine acicular crystals of intermetallic compounds become coarse spherical crystals so that the intermetallic compounds can no longer suppress the propagation of cracks, due to the presence of Bi which is either dissolved as a solid solution or dispersed as fine precipitates formed from a supersaturated solid solution, the matrix itself has good resistance to heat cycles. Therefore, the solder can exhibit stable reliability over long periods.

On the other hand, if the above-described intermetallic compounds are scarce in a solid solution structure of the precipitate-reversion type according to the present invention, it is difficult to suppress the propagation of cracks. Therefore, it is necessary for a eutectic structure of $Ag_3Sn$ or $Cu_6Sn_5$ with Sn to occupy at least 40% of the volume, and to this end, it is necessary to add at least 2.5% of Ag and at least 0.8% of Cu. Preferably, the amount of Ag is at least 2.8% and the amount of Cu is at least 0.9%.

A lead-free solder according to the present invention contains Bi, which lowers the liquidus temperature of a Sn—Ag—Cu alloy, in a suitable amount, that is, in such an amount that the solidus temperature is not lowered too much. Therefore, soldering can be performed under the same conditions as with a Sn-3Ag-0.5Cu) lead-free solder which at present is widely used for soldering of electronic equipment. Accordingly, it has the advantages that not only can it be used with existing soldering equipment, it also has little thermal effect on electronic parts.

A solder alloy and a soldered joint according to the present invention can exhibit sufficient reliability even after a heat cycle test performed for 1500 cycles.

In an embodiment of the present invention, a lead-free solder which is characterized by further containing at least one of Ni, Fe, Co in a total amount of 0.005-0.05 mass % can exhibit sufficient reliability after 1500 cycles in a heat cycle test. At the same time, it can increase the lifespan of the tip of a soldering iron when used with a soldering iron.

In another embodiment of the present invention, a lead-free solder which is characterized by containing at least one of P, Ge, and Ga in a total amount of 0.0002-0.02 mass % can exhibit sufficient reliability even after 1500 cycles in a heat cycle test. At the same time, it can prevent discoloration of the solder surface in a high-temperature environment after soldering.

With a solder having a composition within a preferred range of the present invention, reliability can be adequately exhibited even after 3000 cycles of a heat cycle test.

A lead-free solder according to the present invention can of course be used for soldering of electronic equipment on which are mounted power transistors or coils which generate heat at the time of use. However, the properties of the solder can be more effectively exhibited when it is used for a vehicle-mounted electronic circuit. A vehicle-mounted electronic circuit is a circuit incorporated into a central computer of an electronic control unit of an automobile. It is an apparatus which carries out control such as engine output control or brake control, and it is normally installed in the vicinity of an engine.

BEST MODE FOR CARRYING OUT THE INVENTION

Figure 1:
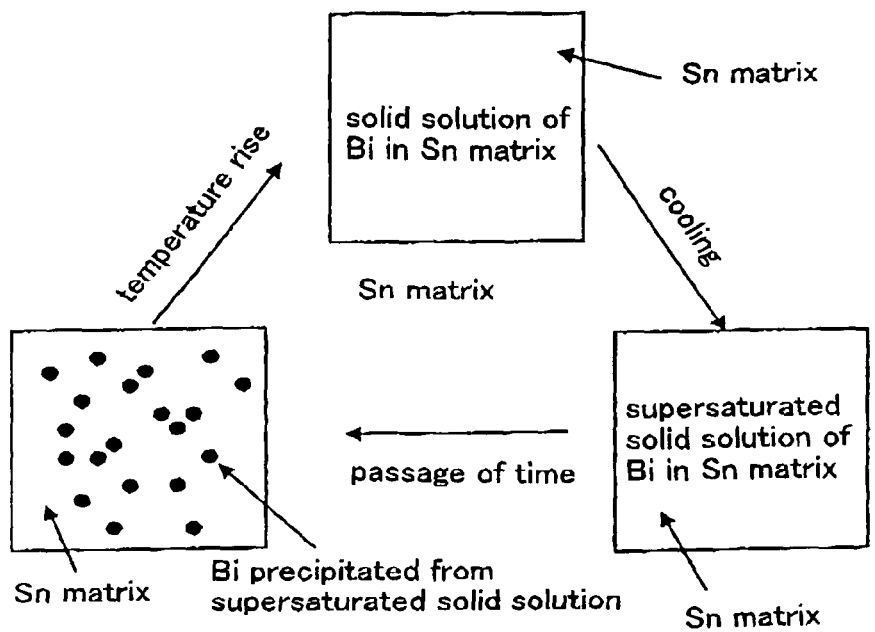
FIG. 1 is a schematic explanatory view of a solid solution structure of the precipitate-reversion type used in the present invention.

The alloy composition of the solder according to the present invention was decided for the following reason.

The upper limit on the content of Bi is 6 mass %. If Bi is added in a larger amount than this, a large amount of a Sn—Bi eutectic structure is formed due to segregation of Bi during soldering. As a result, in a heat cycle environment, Bi does not completely dissolve in Sn, and excess Bi which crystallizes out in the matrix coarsens, whereby resistance to heat cycles ends up decreasing. If the content of Bi is less than 1.5 mass %, due to the solubility limit of Bi at room temperature, there is almost no expectation of precipitation of Bi from a supersaturated solid solution, and the desired improved resistance to heat cycles cannot be obtained. In order to greatly improve the resistance to heat cycles, both the effect of a solid solution of Bi and that of precipitation of Bi from a supersaturated solid solution are necessary. The Bi content is preferably 2.5-5.5 mass %. More preferably, it is at least 2.5 mass % and less than 5 mass %.

Ag contributes to an improvement in resistance to heat cycles by forming the intermetallic compound $Ag_3Sn$ with Sn. Furthermore, Ag has the effects of affording good wettability to portions being soldered during soldering and decreasing the liquidus temperature of Sn. If Ag is added in an amount of less than 2.8 mass %, resistance to heat cycles decreases, while if it is added in excess of 4 mass %, an improvement in resistance to heat cycles and wettability corresponding to the amount which is added cannot be expected. In addition, the liquidus temperature increases and solderability worsens. Furthermore, addition of a large amount of expensive Ag is not desirable from the standpoint of economy. The Ag content is preferably 3-3.4 mass %.

Cu is necessary in order to prevent Cu wiring on a mounted substrate or Cu electrodes of electronic parts from dissolving into molten solder. In usual soldering, soldered joints are melted a plurality of times, and in a repair process, the temperature of soldered joints becomes higher than during ordinary soldering. As a result, Cu erosion occurs in which Cu on a substrate or electronic part is dissolved into molten solder. In particular, with a Sn based lead-free solder, Cu tends to rapidly dissolve so as to cause erosion of Cu on a substrate or a part.

Such Cu erosion is prevented in this invention by including Cu in the solder.

When a semiconductor element or a ceramic substrate is plated with Ni and the plating thickness of Ni is small, severe dissolving of Ni takes place when soldering is carried out with a Sn based lead-free solder. As a result, the metal underneath the Ni plating is exposed, and the Ni plating can no longer function as a barrier layer.

Vehicle-mounted electronic circuits include many mounting substrates and electronic parts which are important for safety. At the time of soldering, it is necessary to completely prevent disconnection of wiring or a decrease in the performance of electronic parts. Therefore, it is important to prevent Cu in portions being soldered from being dissolved. In order to prevent Cu erosion, it is necessary to add at least 0.8 mass % of Cu. However, if Cu is added in excess of 1.2 mass %, the liquidus temperature exceeds 240° C., so the soldering temperature must be increased, and electronic parts and printed circuit boards end up undergoing thermal damage. The addition of Cu also has the effect of suppressing a deterioration in strength in a heat cycle environment. If the content of Cu is smaller than 0.8 mass %, it is not possible to achieve reliability which meets the standards for vehicle-mounted electronic circuits, particularly when the content of Bi is smaller than 5 mass %. A preferred Cu content is 0.9-1.0 mass %.

In the present invention, in order to further improve resistance to heat cycles and improve other properties such as the mechanical strength of the solder itself and the ability to suppress Cu erosion, at least one element selected from the group consisting of Ni, Fe, and Co can be added in a total amount of 0.005-0.05 mass %. If the total amount of these optional elements is smaller than 0.005 mass %, the effect of improving the above-described properties is not exhibited, while if the total amount is larger than 0.05 mass %, the liquidus temperature exceeds 240° C.

In the present invention, at least one element selected from the group is consisting of P, Ge, and Ga can be added in a total amount of 0.0002-0.02 mass % in order to prevent oxidation of solder and suppress its discoloration. If the total amount of these optional elements is smaller than 0.0002 mass %, the effect of preventing oxidation is not obtained, while if they are added in excess of 0.02 mass %, they impair solderability.

In addition, a lead-free solder according to the present invention may contain In and Zn if necessary. When In is added in order to decrease the melting temperature, if more than 1 mass % is added, both Bi and In undergo segregation, and a portion of the solder melts at 125° C. or below. Even if a liquid phase of Sn enriched with In and Bi appears in a portion of a Sn matrix at a high temperature of 125° C., the strength of a soldered joint does not change significantly, but ductility or so-called elongation significantly decreases. If In is added in excess of 1 mass %, ductility nearly disappears, and it becomes difficult to use the alloy for soldering. Therefore, the In content in the Sn—Ag—Cu—Bi alloy is at most 1 mass %.

Although Zn undergoes severe oxidation, it increases reactivity with metal and improves solderability in an inert atmosphere. However, if too much Zn is added to a Sn—Ag—Cu—Bi alloy, it increases the liquidus temperature of the alloy. Therefore, the content of Zn in the alloy is preferably at most 1 mass %.

A lead-free solder having an alloy composition according to the present invention exhibits a desired strength at a high temperature, e.g., at 100° C. or above, due to the solid solution strengthening of a Bi-containing solid solution or a Bi-containing solid solution having intermetallic compounds partially dispersed therein if necessary and at a low temperature, e.g., at 25° C. or lower, due to the solid solution strengthening of a Bi supersaturated solid solution or precipitation strengthening of Bi. A soldered joint providing both of these effects has not existed so far.

Accordingly, the present invention also relates to a vehicle-mounted electronic circuit and particularly a hybrid semiconductor circuit having such a soldered joint. In light of the excellent heat resistance of the soldered joint, the present invention can also be used for soldering a power module.

EXAMPLE 1

In this example, solder alloys having the compositions shown in Table 1 is were prepared, and their properties were evaluated in the following manner.

The results of evaluation of the properties of the examples of the present invention and comparative examples are also shown in Table 1.

TABLE 1

| | | Alloy composition (mass %) | | | | | m.p. (° C.) *1 | | Bonding strength after heat cycle test (N) *2 | | | | Cu erosion *3 | Remarks |
|---|---|---|---|---|---|---|---|---|---|---|---|---|---|---|
| | | | | | | | Solidus Temp. | Liquidus Temp. | 1500 cycles | | 3000 cycles | | | |
| | | Sn | Bi | Ag | Cu | Other | | | Av. | Min. | Av. | Min. | | |
| Ex. | 1 | rem | 1.5 | 3.3 | 0.9 | | 204 | 216 | 40.0 | 26.7 | 25.8 | 14.8 | No | at least 1500 cycles |
| | 2 | rem | 2 | 3.3 | 0.9 | | 202 | 215 | 43.3 | 31.3 | 28.4 | 18.1 | No | at least 1500 cycles |
| | 3 | rem | 2.5 | 3.3 | 0.9 | | 202 | 215 | 48.0 | 34.2 | 32.4 | 20.3 | No | at least 3000 cycles |
| | 4 | rem | 3 | 3.3 | 0.9 | | 199 | 214 | 52.8 | 37.0 | 36.5 | 22.6 | No | at least 3000 cycles |
| | 5 | rem | 4 | 3.3 | 0.9 | | 192 | 213 | 64.6 | 39.7 | 47.5 | 24.9 | No | at least 3000 cycles |
| | 6 | rem | 5 | 3.3 | 0.9 | | 188 | 212 | 70.7 | 45.0 | 53.5 | 29.6 | No | at least 3000 cycles |
| | 7 | rem | 6 | 3.3 | 0.9 | | 184 | 211 | 52.8 | 26.0 | 36.5 | 14.3 | No | at least 1500 cycles |
| | 8 | rem | 1.5 | 3 | 1.1 | | 204 | 230 | 37.1 | 24.1 | 23.6 | 12.9 | No | at least 1500 cycles |
| | 9 | rem | 1.5 | 4 | 1 | | 204 | 231 | 33.6 | 20.8 | 20.9 | 10.8 | No | at least 1500 cycles |
| | 10 | rem | 4 | 3 | 1.1 | | 199 | 230 | 64.4 | 42.3 | 47.3 | 27.1 | No | at least 3000 cycles |
| | 11 | rem | 4 | 4 | 1 | | 199 | 235 | 65.1 | 35.8 | 48.0 | 21.6 | No | at least 3000 cycles |
| | 12 | rem | 5 | 3 | 1.1 | | 188 | 230 | 77.0 | 48.8 | 60.1 | 33.1 | No | at least 3000 cycles |
| | 13 | rem | 5 | 4 | 1.2 | | 188 | 235 | 83.3 | 47.5 | 66.9 | 31.8 | No | at least 3000 cycles |
| | 14 | rem | 3 | 3 | 1 | 0.03 Ni | 199 | 214 | 53.0 | 31.8 | 36.5 | 22.6 | No | at least 3000 cycles |
| | 15 | rem | 3 | 3 | 1 | 0.01 Co | 199 | 214 | 52.7 | 34.3 | 36.9 | 22.3 | No | at least 3000 cycles |
| | 16 | rem | 3 | 3 | 1 | 0.005 Fe | 199 | 214 | 50.1 | 32.6 | 32.6 | 22.8 | No | at least 3000 cycles |
| | 17 | rem | 3 | 3 | 1 | 0.0002 P | 199 | 214 | 54.1 | 32.5 | 37.9 | 21.1 | No | at least 3000 cycles |
| | 18 | rem | 3 | 3 | 1 | 0.01 Ga | 199 | 214 | 52.1 | 33.9 | 33.9 | 23.7 | No | at least 3000 cycles |
| | 19 | rem | 3 | 3 | 1 | 0.015 P | 199 | 214 | 49.8 | 29.9 | 32.4 | 21.2 | No | at least 3000 cycles |
| | 20 | rem | 3 | 3 | 1 | 0.005 Ge | 199 | 214 | 50.0 | 32.5 | 35.0 | 22.8 | No | at least 3000 cycles |
| | 21 | rem | 3 | 3 | 1 | 0.8 In | 198 | 213 | 48.2 | 33.7 | 31.3 | 21.9 | No | at least 3000 cycles |
| | 22 | rem | 3 | 3 | 1 | 0.2 Zn | 199 | 214 | 52.8 | 31.7 | 34.3 | 22.2 | No | at least 3000 cycles |
| Comp. Ex. | 1 | rem | | 3 | 0.5 | | 217 | 220 | 20.3 | 14.3 | 11.6 | 6.9 | Yes | poor resistance to HC |
| | 2 | rem | | 3 | 0.8 | | 217 | 219 | 23.8 | 15.0 | 14.0 | 7.3 | No | poor resistance to HC |
| | 3 | rem | | 3 | 1 | | 217 | 230 | 24.5 | 18.9 | 14.4 | 9.6 | No | poor resistance to HC |
| | 4 | rem | | 3 | 1.2 | | 217 | 249 | 22.4 | 11.7 | 13.0 | 5.5 | No | poor resistance to HC |
| | 5 | rem | | 3 | 1.5 | | 217 | 256 | 37.8 | 22.8 | 24.1 | 12.1 | No | high liquidus temp. |
| | 6 | rem | 1 | 2.5 | 0.5 | | 211 | 219 | 21.0 | 13.0 | 12.1 | 6.2 | Yes | poor resistance to HC |
| | 7 | rem | 1 | 2.8 | 0.5 | | 211 | 218 | 23.1 | 14.3 | 13.5 | 6.9 | Yes | poor resistance to HC |
| | 8 | rem | 1 | 3.3 | 0.7 | | 208 | 217 | 28.0 | 16.9 | 16.9 | 8.4 | Yes | poor resistance to HC |
| | 9 | rem | 1 | 3.3 | 1 | | 208 | 217 | 28.1 | 14.5 | 16.9 | 7.0 | No | poor resistance to HC |
| | 10 | rem | 1 | 4 | | | 208 | 230 | 23.1 | 13.0 | 13.5 | 6.2 | Yes | poor resistance to HC |
| | 11 | rem | 1.5 | 2.5 | 0.5 | | 208 | 218 | 21.0 | 10.4 | 12.1 | 4.8 | Yes | poor resistance to HC |
| | 12 | rem | 2 | 1.5 | 1 | | 205 | 248 | 14.7 | 11.7 | 8.1 | 5.5 | No | poor resistance to HC |
| | 13 | rem | 2 | 2.5 | 0.5 | | 205 | 217 | 20.3 | 10.4 | 11.6 | 4.8 | Yes | poor resistance to HC |
| | 14 | rem | 2 | 3 | | | 206 | 220 | 24.5 | 13.0 | 14.4 | 6.2 | Yes | poor resistance to HC |
| | 15 | rem | 2 | 3 | 0.5 | | 203 | 216 | 28.8 | 16.1 | 17.4 | 7.9 | Yes | poor resistance to HC |
| | 16 | rem | 2 | 3 | 0.8 | | 203 | 216 | 29.8 | 18.5 | 18.1 | 9.4 | No | poor resistance to HC |
| | 17 | rem | 2 | 3.5 | | | 206 | 218 | 24.5 | 13.0 | 14.4 | 6.2 | Yes | poor resistance to HC |
| | 18 | rem | 2 | 4 | | | 206 | 227 | 26.6 | 13.0 | 15.9 | 6.2 | Yes | poor resistance to HC |
| | 19 | rem | 3 | 3 | 0.7 | | 199 | 214 | 35.0 | 18.9 | 22.0 | 9.6 | Yes | poor resistance to HC |
| | 20 | rem | 3 | 3.5 | | | 201 | 216 | 28.7 | 16.3 | 17.3 | 8.0 | Yes | poor resistance to HC |
| | 21 | rem | 3 | 4 | | | 201 | 225 | 27.3 | 15.0 | 16.4 | 7.3 | Yes | poor resistance to HC |
| | 22 | rem | 5 | 1 | 0.5 | | 188 | 223 | 23.1 | 14.3 | 13.5 | 6.9 | Yes | poor resistance to HC |
| | 23 | rem | 5 | 3 | | | 190 | 214 | 56.0 | 32.5 | 39.4 | 19.0 | Yes | |
| | 24 | rem | 5 | 3 | 0.5 | | 188 | 213 | 63.0 | 35.8 | 45.9 | 21.6 | Yes | |
| | 25 | rem | 5 | 3 | 1.5 | 1 In | 185 | 250 | 60.2 | 20.1 | 40.1 | 14.2 | No | high liquidus temp. |
| | 26 | rem | 5 | 3.5 | | | 190 | 214 | 59.5 | 29.3 | 42.6 | 16.6 | Yes | |
| | 27 | rem | 6 | 3.5 | | | 186 | 215 | 42.0 | 16.3 | 27.4 | 8.0 | Yes | poor resistance to HC |
| | 28 | rem | 6 | 4 | | | 187 | 223 | 45.5 | 15.0 | 30.3 | 7.3 | Yes | poor resistance to HC |
| | 29 | rem | 7.5 | 2 | 0.5 | | 174 | 210 | 28.0 | 15.0 | 16.9 | 7.3 | No | poor resistance to HC, low solidus temp. |
| | 30 | rem | 8 | 2 | | | 172 | 212 | 24.5 | 13.7 | 14.4 | 6.5 | Yes | poor resistance to HC, low solidus temp. |

The measurement of melting point, the heat cycle test, and the Cu erosion test in Table 1 were carried out as follows.

Melting Point Measurement (*1):

The solidus temperature and liquidus temperature of each alloy were measured using a differential scanning calorimeter (DSC) at a rate of temperature increase of 5° C. per minute with a sample weight of approximately 15 grams.

Taking into consideration thermal effects on electronic parts and printed circuit boards during soldering, the liquidus temperature is preferably 240° C. or lower. In order not to reduce the bonding strength of a soldered joint at high temperatures, the solidus temperature should be at least 170° C.

Heat Cycle Test (*2):

Solder powder having an average particle diameter of 30 μm was prepared from each of the solder alloys shown in Table 1. The solder powder was mixed with a flux having the following composition to prepare a solder paste.

amount of solder powder: 89 mass %;
amount of flux: 11 mass.
flux composition:
55 mass % of polymerized rosin,
7 mass % of hydrogenated castor oil,
1 mass % of diphenylguanidine Hbr, and
37 mass % of diethylene glycol monohexyl ether.

Chip resistor parts measuring 3.2×1.6×0.6 mm were soldered to patterned portions to be soldered each measuring 1.6×1.2 mm provided on a six-layer FR-4 glass epoxy substrate measuring 1500 mm×1400 mm and having a thickness of 1.6 mm. After the solder paste was printed on the electrode portions of the substrate using a metal mask with a thickness of 150 μm, soldering was carried out by heating the substrate with chip resisters disposed thereon in a reflow furnace set to a peak temperature of 245° C. The resulting printed circuit board (substrate) having the chip resistor parts mounted thereon was then placed into a heat cycle tester set so as to maintain a temperature of −55° C. and 125° C. for 30 minutes at each temperature, and a substrate which was repeatedly exposed to this heat cycle environment for 1500 cycles and 3000 cycles was used as a test specimen. The chip resistor parts of the test specimen were peeled off using a shear strength tester at a shear rate of 5 mm per minute, and the peeling strength (N) at this time was measured. Testing was performed on 15-20 test specimens. The results are shown in Table 1. The data in Table 1 are the average values and the minimum values for the 15-20 specimens.

In a heat cycle test, the bonding strength decreases primarily due to the formation of cracks. The more severe is the propagation of cracks, the lower is the bonding strength. In this heat cycle test, if the cracks pass completely through a joint, the bonding strength of the joint becomes 10 N or less. In a heat cycle test for 1500 cycles, if the average value of the bonding strength is at least 30 N and the minimum value is at least 20 N, cracks do not completely pass through the joints, and the bonding strength is sufficient from a reliability standpoint. It is possible to guarantee reliability over a still longer period if the average value of the bonding strength is at least 30 N and the minimum value is at least 20 N under more severe conditions of 3000 cycles.

Cu Erosion Test (*3):

Each alloy was charged into a small wave soldering bath with a capacity of 15 kg and heated at 260° C. to melt it. The wave height from the nozzle of the wave soldering bath was then adjusted to be 5 mm.

The test specimen used in this test was an FR4 glass epoxy substrate which had copper wiring with a thickness of 35 μm and which was cut to a suitable size.

The test method comprised applying a pre-flux to the surface of the copper wiring of the test specimen and preheating the specimen for approximately 60 seconds to bring the temperature of the substrate to approximately 120° C. The test specimen was then immersed for 3 seconds in the spouting molten solder by placing it 2 mm above the nozzle of the wave soldering bath. This process was performed repeatedly, and the number of times immersion was carried out until the dimension (thickness) of the copper wiring on the test specimen was reduced by half was measured. From the standpoint of the reliability of vehicle-mounted electronic circuits, it should be possible to carry out immersion at least four times without the wiring decreasing in dimension by half. Those specimens which did not decrease by half in dimension after immersion four times were evaluated as "no", and those which decreased in dimension by half in three or fewer immersions were evaluated as "yes".

As can be seen from the results shown in Table 1', a lead-free solder according to the present invention not only has excellent resistance to heat cycles, but in addition Cu erosion does not take place.

Furthermore, a lead-free solder according to the present invention has a solidus temperature of at least 180° C., so when a vehicle-mounted electronic circuit soldered with a lead-free solder according to the present invention is in a high-temperature state due to being disposed in the vicinity of the hood of an automobile, it does not easily undergo peeling. Furthermore, it has a liquidus temperature of at most 230° C., so electronic parts and printed circuit boards do not undergo thermal damage during soldering.

In contrast, lead-free solders in comparative examples which are said to have excellent resistance to heat cycles did not satisfy the resistance to heat cycles (HC) demanded of vehicle-mounted electronic circuits, or the solidus temperature or the liquidus temperature was too low or too high, so these solders were not suitable for zo soldering of a vehicle-mounted electronic circuit.

EXAMPLE 2

In this example, soldered joints of a simulated hybrid semiconductor circuit were formed from a lead-free solder according to the present invention, and the soldered joints were evaluated in the following manner.

Test 1:

A sheet-like solder pellet having a thickness of 200 μm and measuring 30 mm×40 mm and having a solder composition as set forth in Table 2 was interposed between a copper-clad alumina substrate 1 measuring 30 mm×40 mm×0.3 mm and a Cu base substrate (metal substrate) 2 measuring 50 mm×50 mm×3.5 mm. Reflow soldering was then carried out in a hydrogen reducing atmosphere with a peak temperature of 260° C. to prepare a test substrate.

Figure 2:
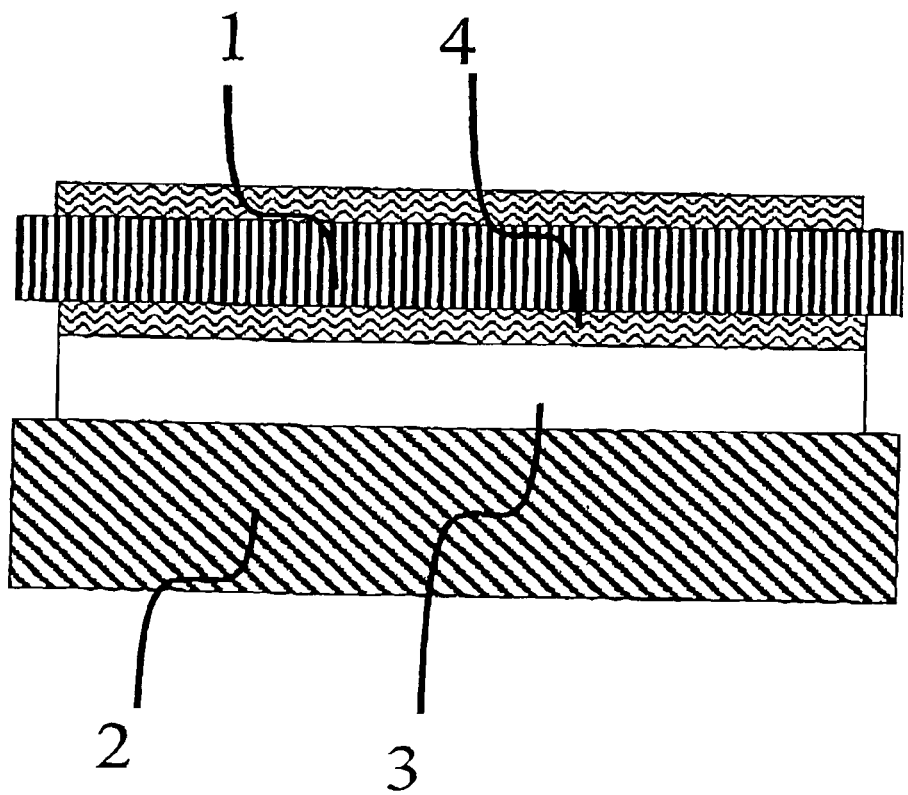
FIG. 2 is a cross-sectional view of a test substrate obtained in Test 1 of Example 2.

FIG. 2 is a cross-sectional view of a test substrate obtained in this test. The test substrate was placed into a heat cycle tester set to perform holding at 30 minutes at each of −55° C. and +125° C. with a transition time of 0 minutes between −55° C. and +125° C., and the rate of propagation of cracks after 2000 cycles was observed in a cross section. Table 2 shows the average value of the crack length with respect to the maximum length of a soldered joint observed with an optical microscope in the longest cross section of the soldered joint after 2000 cycles.

Test 2:

A sheet-like solder pellet having a thickness of 200 μm and measuring 35 mm×70 mm and having a solder composition as set forth in Table 2 was placed between an aluminum-clad alumina substrate 5 measuring 35 mm×70 mm×0.2 mm and a Cu base substrate 6 measuring 50 mm×120 mm×3 mm thick, and reflow soldering was carried out in a hydrogen reducing atmosphere with a peak temperature of 260° C. to obtain a test substrate.

Figure 3:
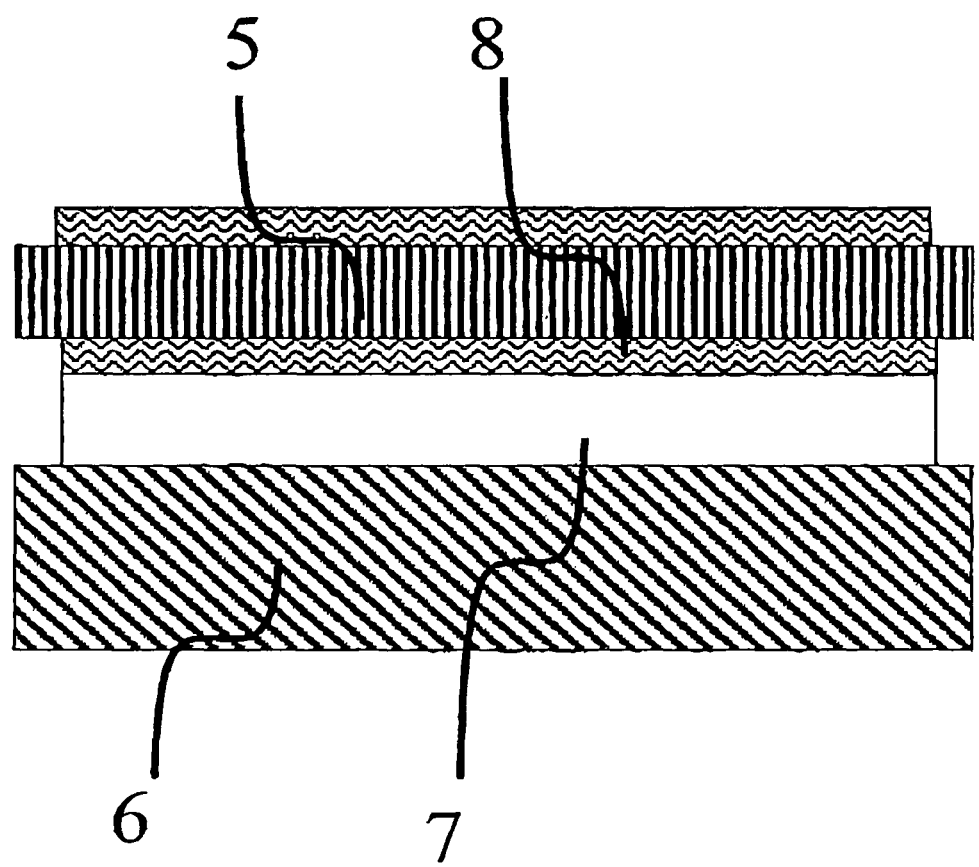
FIG. 3 is a cross-sectional view of a test substrate obtained in Test 2 of Example 2.

FIG. 3 is a cross-sectional view of the test substrate obtained in this test. Under the same conditions as for Test 1, the rate of propagation of cracks was observed in a cross section after 2000 cycles. Table 2 shows the average value of the crack length with respect to the maximum length of a soldered joint observed with an optical microscope in the longest cross section of the soldered joint after 2000 cycles.

Test 3:

A sheet-like solder pellet having a thickness of 100 μm and measuring 7 mm×7 mm and having a solder composition as set forth in Table 2 was placed between a Si element 9 measuring 7 mm×7 mm×400 mm and a Cu lead frame 10 measuring 20 mm×20 mm×0.3 mm thick, and reflow soldering was carried out in a hydrogen reducing atmosphere with a peak temperature of 260° C. to obtain a test substrate.

Figure 4:
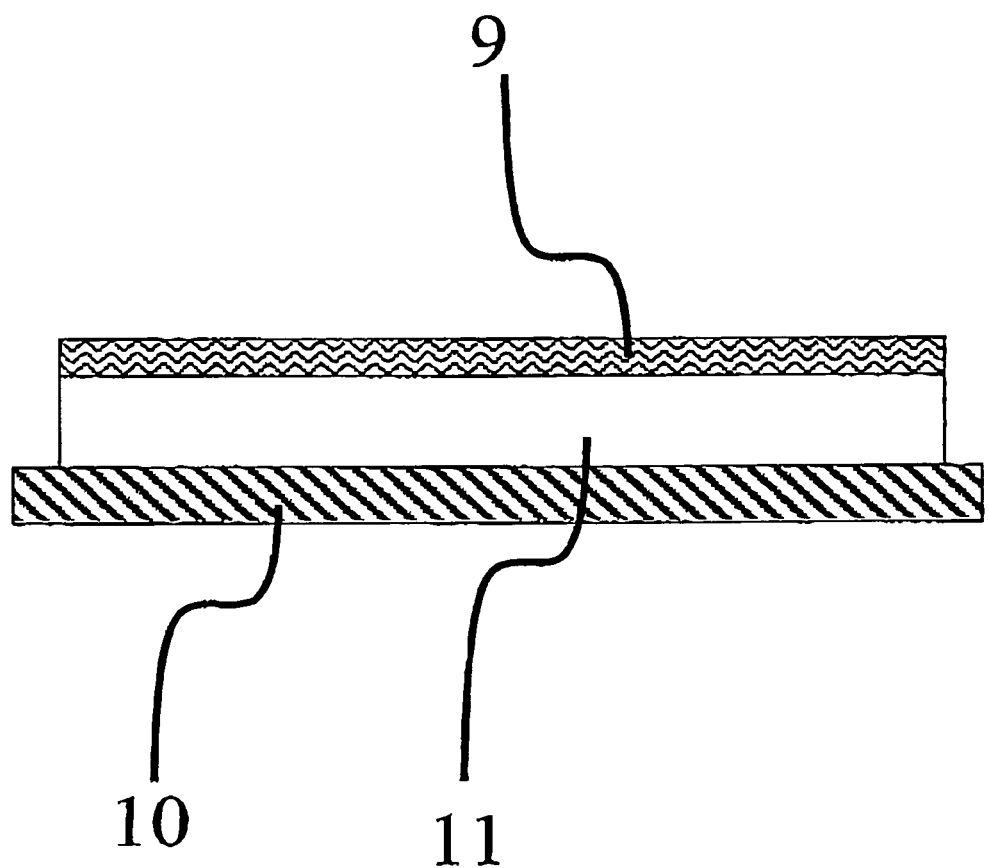
FIG. 4 is a cross-sectional view of a test substrate obtained in Test 3 of Example 2.

FIG. 4 is a cross-sectional view of a test substrate obtained in this test. Under the same conditions as for Test 1, the rate of propagation of cracks after 2000 cycles was observed in a cross section. Table 2 shows the average value of the crack length with respect to the maximum length of the soldered joint observed with an optical microscope in the longest cross section of the soldered joint after 2000 cycles.

TABLE 2

|  |  | Composition (mass %) | | | | % Propagation of cracks after 2000 cycles of a heat cycle test | | |
| --- | --- | --- | --- | --- | --- | --- | --- | --- |
|  |  | Sn | Bi | Ag | Cu | Other | Test 1 | Test 2 | Test 3 |
| Examples | 1 | rem | 1.5 | 3 | 0.8 |  | 49 | 45 | 35 |
|  | 2 | rem | 2.5 | 3 | 0.9 |  | 42 | 43 | 25 |
|  | 3 | rem | 3 | 3 | 0.8 |  | 30 | 35 | 20 |
|  | 4 | rem | 4 | 3 | 0.9 |  | 32 | 32 | 22 |
|  | 5 | rem | 5 | 3 | 0.8 |  | 25 | 25 | 18 |
|  | 6 | rem | 6 | 3 | 0.8 |  | 40 | 36 | 25 |
|  | 7 | rem | 3 | 3 | 0.9 | 0.03 Ni | 33 | 34 | 31 |
|  | 8 | rem | 3 | 3 | 0.9 | 0.01 Co | 35 | 38 | 22 |
|  | 9 | rem | 3 | 3 | 0.9 | 0.005 Fe | 35 | 32 | 25 |
|  | 10 | rem | 3 | 3 | 0.9 | 0.0002 P | 29 | 29 | 26 |
|  | 11 | rem | 3 | 3 | 0.9 | 0.015 P | 30 | 31 | 21 |
|  | 12 | rem | 3 | 3 | 0.9 | 0.005 Ge | 35 | 34 | 24 |
|  | 13 | rem | 3 | 3 | 0.9 | 0.8 In | 37 | 36 | 25 |
| Comp. Ex. | 14 | rem | 0 | 3 | 0.5 |  | 75 | 78 | 50 |
|  | 15 | rem | 8 | 3 | 0.5 |  | 90 | 89 | 62 |

From Table 2, it can be seen that with a hybrid semiconductor circuit of any of the types of Test 1, Test 2, and Test 3, a hybrid semiconductor circuit formed using a solder having a Sn—Bi—Ag—Cu composition according to the present invention had slower growth of crack length and higher reliability than a hybrid semiconductor circuit using a comparative example of a solder having a Sn—Ag—Cu composition.

The invention claimed is:

1. An automotive vehicle having an electronic circuit mounted on a portion of the vehicle which reaches a temperature of at least 100° C. during operation of an engine of the vehicle, the electronic circuit including a soldered joint made from a lead-free solder consisting of Ag:2.8-4 mass %, Bi:2-6 mass %, Cu:0.8-1.2 mass %, optionally at least one of Ni, Fe, and Co in a total amount of 0.005-0.05 mass %, optionally at least one of P, Ge, and Ga in a total amount of 0.0002-0.02 mass %, optionally greater than 0 to at most 1 mass % of In, optionally greater than 0 to at most 1 mass % of Zn, and a remainder of Sn, the soldered joint having a precipitate-reversion solid solution structure in which Bi is present in the soldered joint in a supersaturated solid solution in Sn or as fine precipitates from a supersaturated solid solution at room temperature and is in solid solution in Sn at 125° C.

2. An automotive vehicle as claimed in claim 1 wherein the lead-free solder includes at least one of P, Ge, and Ga in a total amount of 0.0002-0.02 mass %.

3. An automotive vehicle as claimed in claim 1 wherein the lead-free solder includes greater than 0 to at most 1 mass % of In.

4. An automotive vehicle as claimed in claim 1 wherein the lead-free solder includes greater than 0 to at most 1 mass % of Zn.

5. An automotive vehicle as claimed in claim 1 wherein the lead-free solder includes Ag:3-3.3 mass %, Bi:2.5-5 mass %, and Cu:0.9-1.1 mass %.

6. An automotive vehicle as claimed in claim 1 wherein the lead-free solder includes at least one of Ni, Fe, and Co in a total amount of 0.005-0.05 mass %.

7. An automotive vehicle as claimed in claim 1 wherein the lead-free solder has a solidus temperature of at least 180° C. and a liquidus temperature of at most 240° C.

8. An automotive vehicle as claimed in claim 1 wherein the soldered joint can resist 1500 cycles in a heat cycle test comprising exposure to 125° C. and -55° C for 30 minutes at each temperature without penetration of a crack through the soldered joint.

9. An automotive vehicle as claimed in claim 8 wherein the soldered joint can resist 3000 cycles in the heat cycle test without penetration of a crack through the soldered joint.

10. An automotive vehicle as claimed in claim 1 wherein the lead-free solder contains 2.5-6 mass % of Bi.

11. An automotive vehicle as claimed in claim 1 wherein the lead-free solder contains 3-5 mass % of Bi.

* * * * *